US009666960B2

(12) United States Patent
Li et al.

(10) Patent No.: US 9,666,960 B2
(45) Date of Patent: May 30, 2017

(54) POWER CONNECTOR FOR CONNECTING A CONDUCTIVE WIRE TO A CIRCUIT BOARD

(71) Applicant: Tyco Electronics (Shanghai) Co. Ltd., Shanghai (CN)

(72) Inventors: Hua Li, Shanghai (CN); Xian Li, Shanghai (CN)

(73) Assignee: Tyco Electronics (Shanghai) Co. Ltd., Shanghai (CN)

( * ) Notice: Subject to any disclaimer, the term of this patent is extended or adjusted under 35 U.S.C. 154(b) by 0 days.

(21) Appl. No.: 15/042,783

(22) Filed: Feb. 12, 2016

(65) Prior Publication Data

US 2016/0240948 A1 Aug. 18, 2016

(30) Foreign Application Priority Data

Feb. 13, 2015 (CN) .......................... 2015 1 0082461

(51) Int. Cl.

| | |
|---|---|
| ***H01R 12/00*** | (2006.01) |
| ***H05K 1/00*** | (2006.01) |
| ***H01R 12/53*** | (2011.01) |
| *H01R 4/18* | (2006.01) |
| *H01R 11/16* | (2006.01) |

(52) U.S. Cl.

CPC ............. *H01R 12/53* (2013.01); *H01R 4/185* (2013.01); *H01R 11/16* (2013.01)

(58) Field of Classification Search

CPC ...... H01R 12/75; H01R 12/52; H01R 12/526; H01R 13/6595; H01R 43/0235; H01R 43/0236

USPC ........................ 439/81, 82, 83, 78, 751, 523

See application file for complete search history.

(56) References Cited

U.S. PATENT DOCUMENTS

| | | | | |
|---|---|---|---|---|
| 7,527,533 B2 * | 5/2009 | Lappoehn | H01R 12/585 | 439/751 |
| 7,957,156 B2 * | 6/2011 | Palomo | H01R 12/585 | 361/779 |
| 8,075,322 B2 * | 12/2011 | Schwettmann | H01R 11/28 | 439/78 |
| 8,360,803 B2 * | 1/2013 | Sakai | H01R 4/70 | 439/523 |
| 8,632,346 B2 * | 1/2014 | Wittig | H01R 4/184 | 439/553 |
| 8,727,815 B1 * | 5/2014 | Mongold | H01R 43/205 | 439/751 |
| 8,951,063 B2 * | 2/2015 | Iio | H01R 13/5216 | 439/523 |
| 8,992,236 B2 * | 3/2015 | Wittig | H01R 12/585 | 439/82 |

* cited by examiner

*Primary Examiner* — Hae Moon Hyeon

(74) *Attorney, Agent, or Firm* — Barley Snyder

(57) ABSTRACT

A power connector is disclosed. The power connector has a circuit board, a conductive wire, an insulation base, and at least one conductive terminal. The at least one conductive terminal has a first connecting end portion electrically connected with the circuit board and a second connecting end portion electrically connected with the conductive wire. The at least one conductive terminal is fixed into the insulation base such that a top end of the first connecting end portion protrudes from a bottom surface of the insulation base to electrically connect to the circuit board.

16 Claims, 6 Drawing Sheets

POWER CONNECTOR FOR CONNECTING A CONDUCTIVE WIRE TO A CIRCUIT BOARD

CROSS-REFERENCE TO RELATED APPLICATION

This application claims the benefit of the filing date under 35 U.S.C. §119(a)-(d) of Chinese Patent Application No. 201510082461.2 filed on Feb. 13, 2015, the whole disclosure of which is incorporated herein by reference.

FIELD OF THE INVENTION

The invention relates to a power connector, and more specifically, to a power connector connecting a conductive wire to a circuit board.

BACKGROUND

In the prior art, an electrical connection of a conductive wire with the circuit board is generally achieved by a pair of male and female power connectors matched with each other. The female power connector is typically preinstalled on the circuit board, and the male power connector is preinstalled on an end of the conductive wire. In this way, it is possible to achieve the electrical connection between the conductive wire and the circuit board by inserting the male power connector into the female power connector.

It is necessary in the prior art to use the pair of male and female power connectors particularly matched with each other to achieve the electrical connection of the conductive wire with the circuit board, which may result in an increased cost. In addition, the pair of power connectors installed onto the circuit board is subject to disconnection under a certain external pulling force.

SUMMARY

An object of the invention, among others, is to provide a single power connector which may electrically connect conductive wires onto a circuit board. The disclosed power connector has a circuit board, a conductive wire, an insulation base, and at least one conductive terminal. The at least one conductive terminal has a first connecting end portion electrically connected with the circuit board and a second connecting end portion electrically connected with the conductive wire. The at least one conductive terminal is fixed into the insulation base such that a top end of the first connecting end portion protrudes from a bottom surface of the insulation base to electrically connect to the circuit board.

BRIEF DESCRIPTION OF THE DRAWINGS

The invention will now be described by way of example with reference to the accompanying figures, of which.

DETAILED DESCRIPTION OF EMBODIMENT(S)

The invention is explained in greater detail below with reference to embodiments of a power connector. This invention may, however, be embodied in many different forms and should not be construed as limited to the embodiments set forth herein; rather, these embodiments are provided so that this disclosure will be thorough and complete and still fully convey the scope of the invention to those skilled in the art.

Figure 1:
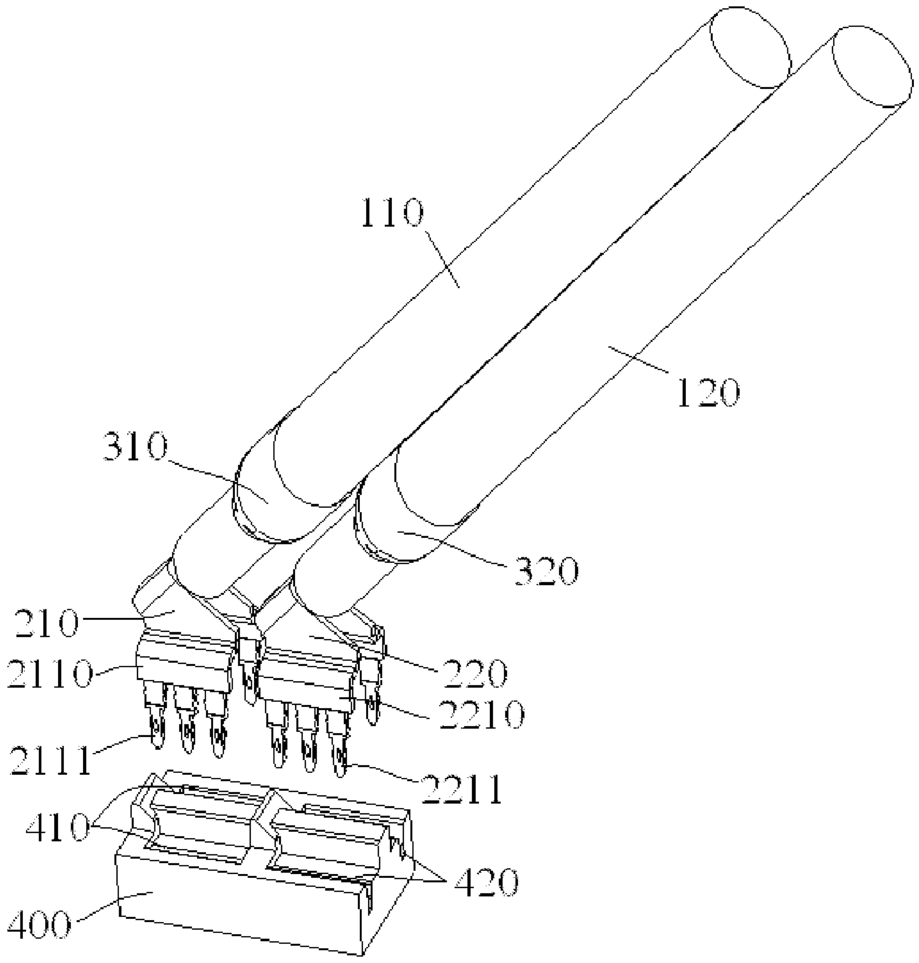
FIG. 1 is a perspective view of a power connector according to an embodiment of the disclosure.

The power connector according to the present invention, as shown in FIG. 1, includes conductive wires 110, 120, conductive terminals 210, 220, heat shrinkable tubes 310, 320, and an insulation base 400. The major components of the invention will now be described in greater detail.

Conductive wires 110, 120 may be any form of conductive wire known to those with ordinary skill in the art. Conductive wires 110, 120 include conductors 111, 121, as shown in FIG. 3.

As shown in FIGS. 1, 2, 4 and 5, conductive terminals 210, 220 have first connecting end portions 211, 221 and second connecting end portions 212, 222. The first connecting end portions 211, 221 of the conductive terminals 210, 220 include plate-like bases 2110, 2210 and at least one pin-like inserting portion 2111, 2211. The pin-like inserting portions 2111, 2211 are integrally connected to the plate-like bases 2110, 2210 respectively. Protrusions 201, 202 shown in FIG. 2 may be formed on roots of the pin-like inserting portions 2111, 2211.

Figure 2:
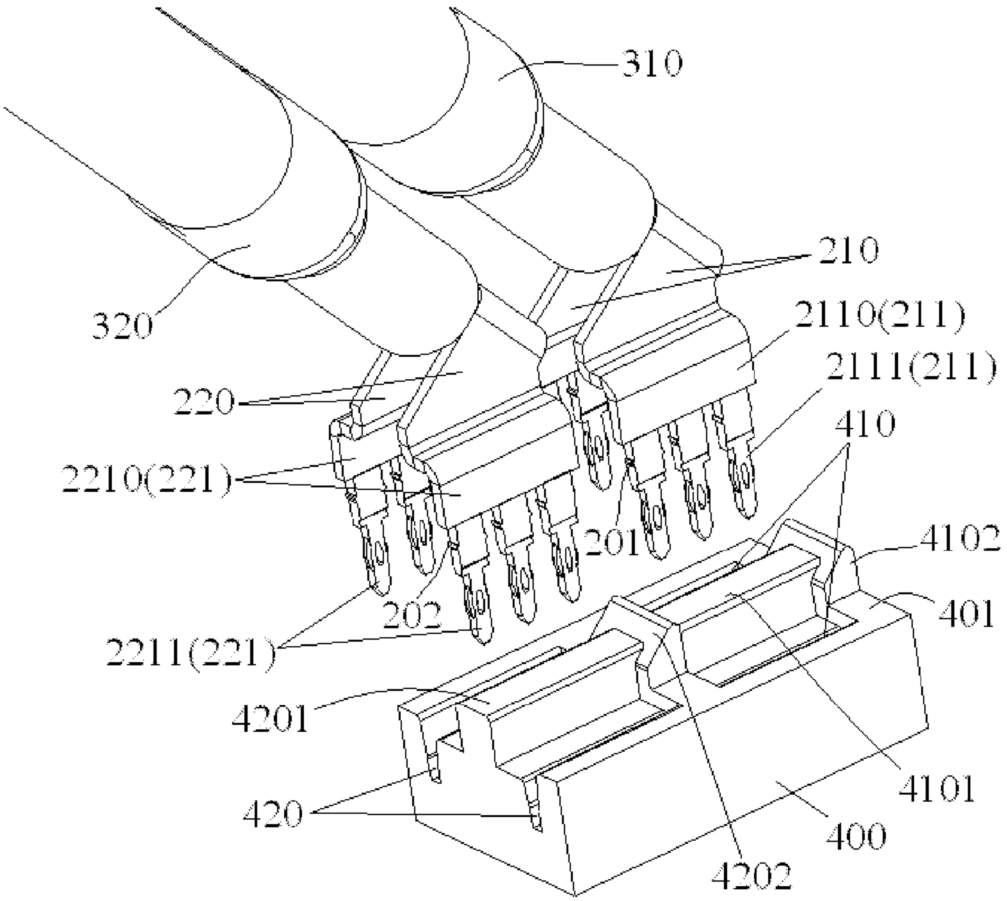
FIG. 2 is an enlarged view of conductive terminals and an insulation base of the power connector of FIG. 1.
Figure 3:
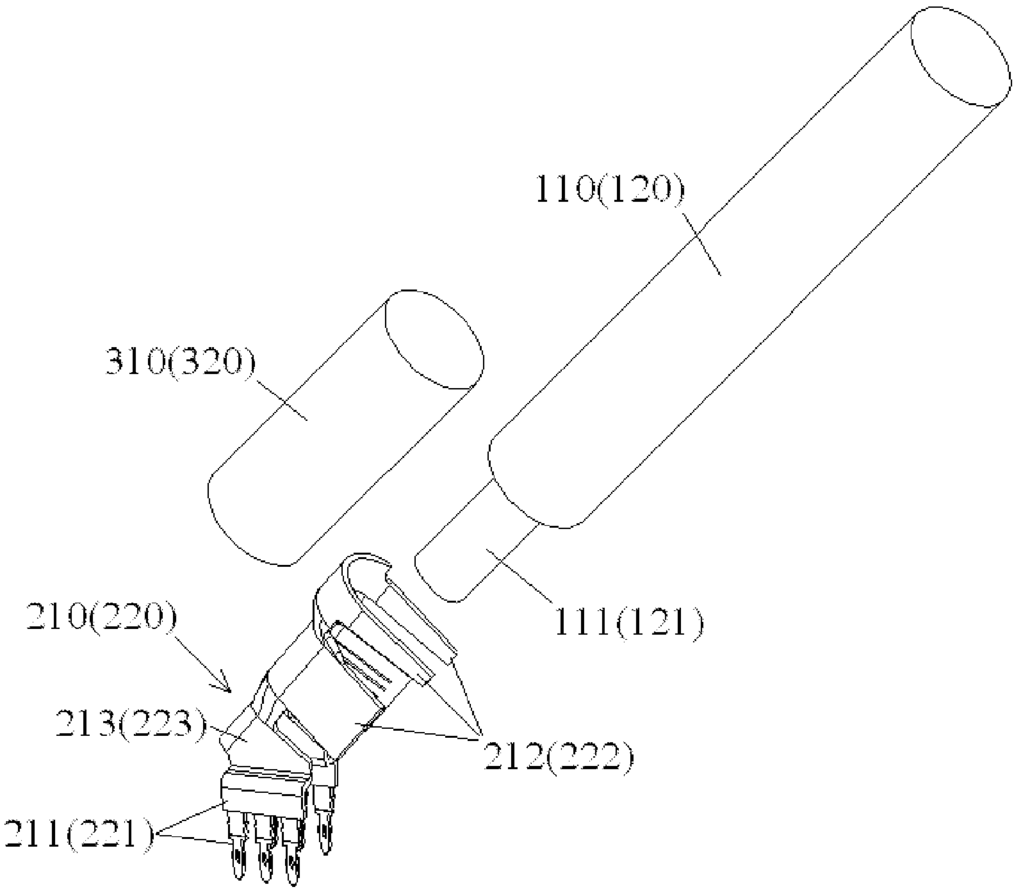
FIG. 3 is an exploded view of the conductive terminals, conducting wires and heat shrinkable tubes of the power connector of FIG. 1.
Figure 4:
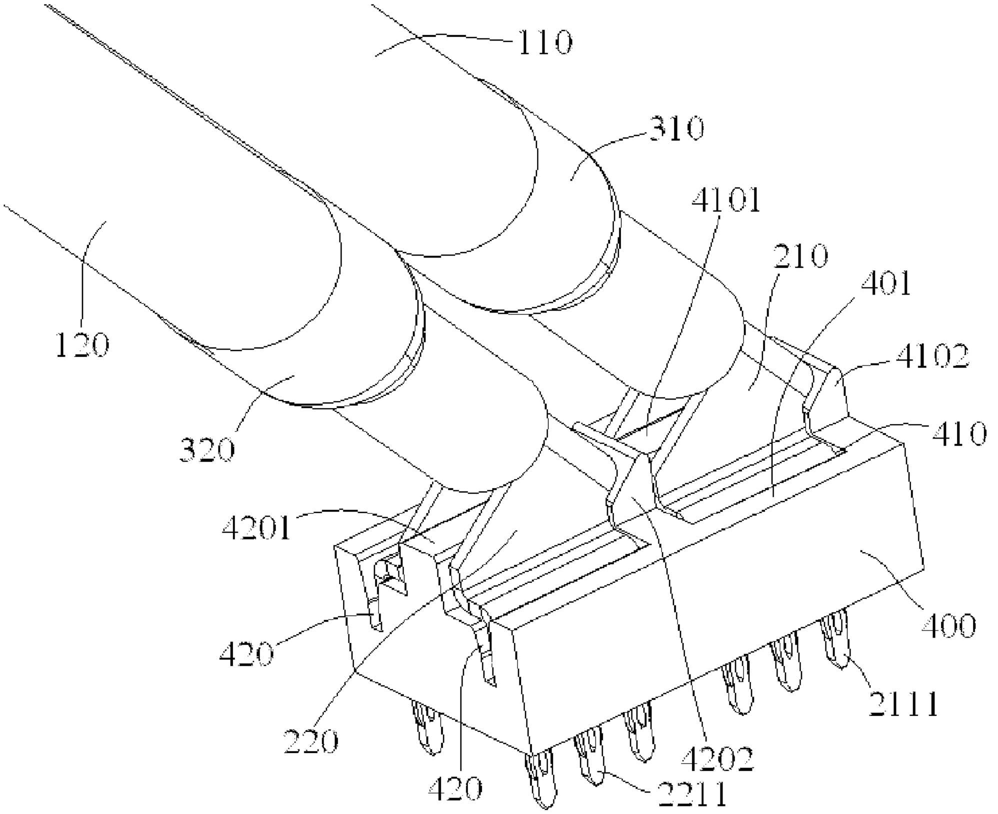
FIG. 4 is a perspective view of the conductive terminals of the power connector of FIG. 1 inserted into the insulation base.
Figure 5:
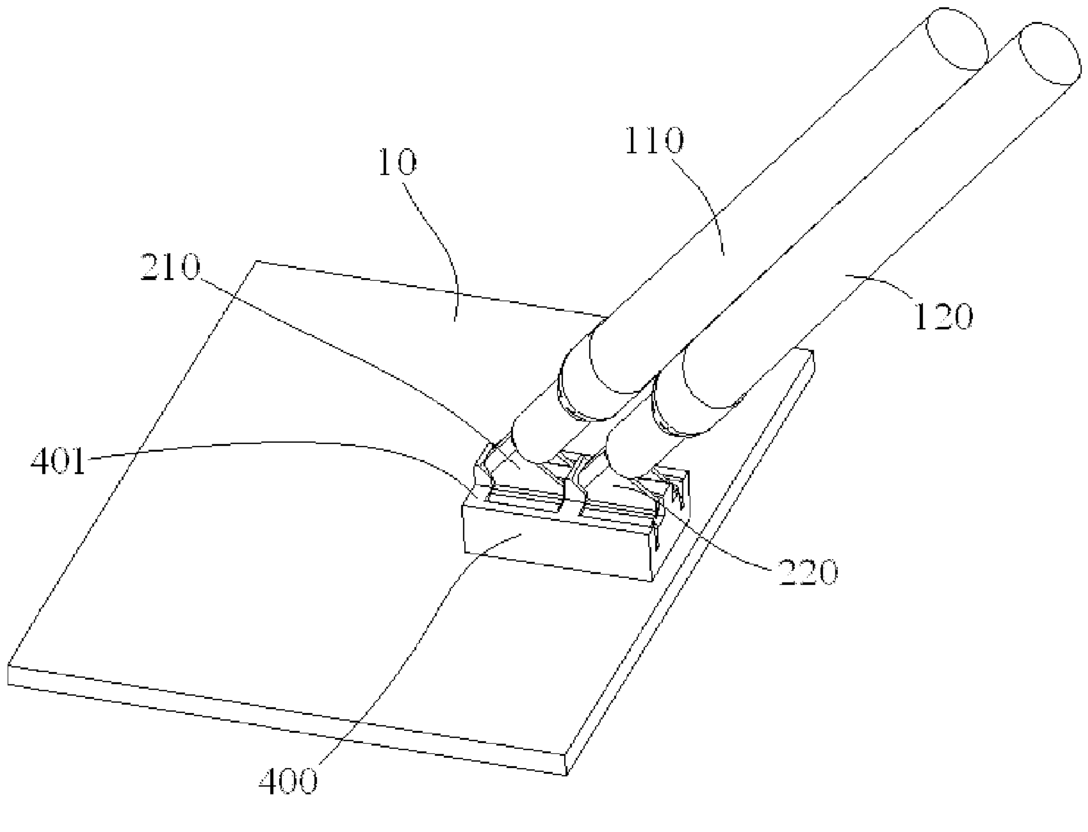
FIG. 5 is a top perspective view of the power connector of FIG. 4 installed onto a circuit board.

In an embodiment shown in FIGS. 2, 3 and 4, the conductive terminals 210, 220 may further include a pair of intermediate connecting portions 213, 223 which are spaced apart from and opposed to each other, the pair of first connecting end portions 211, 221 being respectively connected to the pair of intermediate connecting portions 213, 223.

Heat shrinkable tubes 310, 320 may be any form of heat shrinkable tube known to those with ordinary skill in the art.

Figure 6:
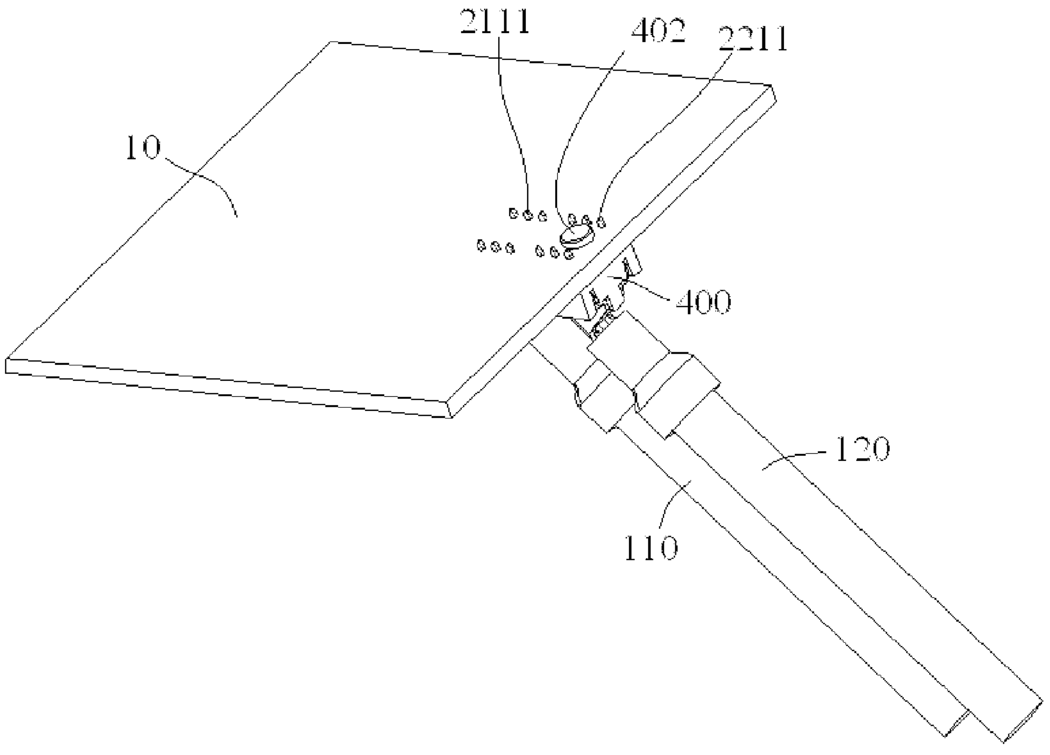
FIG. 6 is a bottom perspective view of the power connector of FIG. 4 installed onto the circuit board.

As shown in FIGS. 1 and 2, the insulation base 400 is formed with slots 410, 420. A top surface of the insulation base 400 is formed with first positioning protrusions 4101, 4201 extending in a first longitudinal direction of the insulation base 400, and second positioning protrusions 4102, 4202 extending in a second transverse direction of the insulation base 400, perpendicular to the first direction. As shown in FIG. 6, a thread hole (not shown) may be formed in the insulation base 400, and a screw 402 adapted to be threaded into the thread hole of the insulation base 400. As shown in FIGS. 2-4, either side of the top surface of the insulation base 400 may be formed with a planar surface 401.

The connections and assembly of the power connector will now be described.

As shown in FIGS. 1, 2, 4 and 5, the first connecting end portions 211, 221 are electrically connected with a circuit board 10 and second connecting end portions 212, 222 are electrically connected with the conductive wires 110, 120, respectively. In the illustrated embodiment, one of the pair of conductive terminals 210, 220 is used as a positive power terminal, and the other is used as a negative power terminal.

The first connecting end portions 211, 221 of the conductive terminals 210, 220 are inserted into the slots 410, 420 of the insulation base 400, respectively. As clearly shown in FIG. 4, after the first connecting end portions 211, 221 of the conductive terminals 210, 220 have been inserted into the slots 410, 420 of the insulation base 400 respectively, each of inserting portions 2111, 2211 of the first connecting end portions 211, 221 protrudes from a bottom surface of the insulation base 400 to be inserted into inserting holes (not shown) in the circuit board 10.

An elastic sheet (not shown) protruding outwardly may be formed on each of the first connecting end portions 211, 221, including the plate-like bases 2110, 2210, and a groove (not shown) engaged with the elastic sheet is formed in an inner wall of each of the slots 410, 420 of the insulation base 400, so that the conductive terminals 210, 220 with plate-like bases 2110, 2210 are locked into the slots 410, 420. As shown in FIGS. 2 and 4, recesses engaged with the protrusions 201, 202 are formed in the slots 410, 420 of the insulation base 400, so that the pin-like inserting portions 2111, 2211 are locked into the slots 410, 420, respectively. In this way, it is possible to firmly fix the conductive terminals 210, 220 into the insulation base 400 and prevent withdrawal therefrom. In another embodiment of the invention, the first connecting portions 211, 221 of the conductive terminals 210, 220 may also be molded into the insulation base 400 in an insert-molding manner. In this way, it is convenient to firmly fix the conductive terminals 210, 220 into the insulation base 400, and the manufacture thereof is facilitated.

As shown in FIGS. 2, 3 and 4, a fish-eye hole is formed in each of the pin-like inserting portions 2111, 2211, so that the pin-like inserting portions 2111, 2211 are interference fit into insertion holes of the circuit board 10. Thus, in order to insert the pin-like inserting portions 2111, 2211 into the insertion holes of the circuit board 10, it is necessary to apply a large press force onto the conductive terminals 210, 220 by a press tool. A press tool may be placed on planar surface 401 so that the pin-like inserting portions 2111, 2211 of the power connector is pressed downwardly into the inserting holes of the circuit board 10 by the press tool, respectively. In an exemplary embodiment of the disclosure, the bottom surface of the insulation base 400 is formed to be parallel with a surface of the circuit board 10. In this way, it is possible to ensure the pin-like inserting portions 2111, 2211 protruding from the bottom surface of the insulation base 400 are perpendicularly inserted into the inserting holes of the circuit board 10 respectively.

After the conductive terminals 210, 220 are inserted into the insulation base 400, as shown in FIGS. 3 and 4, inner sides of the pair of intermediate connecting portions 213, 223 of the conductive terminals 210, 220 are positioned against both sides of each of the first positioning protrusions 4101, 4201, and ends of the pair of intermediate connecting portions 213, 223 are positioned against the second positioning protrusions 4102, 4202 respectively, so that the first connecting end portions 211, 221 of the conductive terminals 210, 220 are perpendicular to the bottom surface of the insulation base 400. In this way, it is possible to ensure the pin-like inserting portions 2111, 2211 of the first connecting end portions 211, 221 are perpendicularly inserted into the inserting holes of the circuit board 10 respectively.

As shown in FIGS. 1, 2 and 3, in the illustrated embodiment, the second connecting portions 212, 222 are crimped onto ends of the conductive wires 110, 120 and electrically connected with conductors 111, 121, respectively.

The heat shrinkable tubes 310, 320 are shrunk onto the second connecting end portions 212, 222 and the ends of the conductive wires 110, 120 to realize an insulation recovery of the connecting portions between the conductive terminals 210, 220 and the conductive wires 110, 120.

FIG. 3 shows a schematic view of the conductive terminals 210, 220, conductive wires 110, 120 and heat shrinkable tubes 310, 320, wherein the conductive terminals 210, 220 have not been crimped onto the conductive wires 110, 120, and the heat shrinkable tubes 310, 320 have not been heat shrunk onto the conductive terminals 210, 220 and the conductive wires 110, 120.

As depicted in FIG. 6, after the first connecting portions 211, 221 of the conductive terminals 210, 220 are electrically connected onto the circuit board 10, the screw 420 passes through the circuit board 10 and is screwed into the thread hole of the insulation base 400 so as to fasten the insulation base 400 onto the circuit board 10. In this case, since the insulation base 400 is fastened onto the circuit board 10 through the screw 402, even if a predetermined external force is exerted on the conductive wires 110, 120, the conductive terminals 210, 220 will not disconnected from the circuit board 10, thereby ensuring a reliable electrical connection between the conductive terminals 210, 220 and the circuit board 10.

Advantageously, the single power connector of the invention can be produced at a lower cost than connectors in the prior art requiring both male and female connectors. Furthermore, the disclosed power connector may withstand a certain external pulling force so that conductive terminals thereof are not disconnected from a circuit board.

What is claimed is:

1. A power connector comprising:

a circuit board;

a conductive wire;

an insulation base; and at least one conductive terminal having a pair of first connecting end portions electrically connected with the circuit board, a second connecting end portion electrically connected with the conductive wire, and a pair of intermediate connecting portions spaced apart from and opposed to each other, the pair of first connecting end portions respectively connected to the pair of intermediate connecting portions, the at least one conductive terminal fixed into the insulation base such that a top end of each of the pair of first connecting end portions protrudes from a bottom surface of the insulation base to electrically connect to the circuit board.

2. The power connector according to claim 1, wherein the insulation base has at least one slot into which one of the pair of first connecting end portions of the conductive terminal is inserted.

3. The power connector according to claim 2, wherein each of the pair of first connecting end portions has a plate-like base and at least one pin-like inserting portion integrally connected to the plate-like base, a top end of the pin-like inserting portion protruding from the bottom surface of the insulation base.

4. The power connector according to claim 3, wherein at least one protrusion is formed on a root of the pin-like inserting portion.

5. The power connector according to claim 3, wherein the pin-like inserting portions are inserted into the circuit board in an interference fit manner.

6. The power connector according to claim 5, wherein either side of a top surface of the insulation base has a planar surface.

7. The power connector according to claim 1, wherein each of the pair of first connecting end portions is insert-molded into the insulation base.

8. The power connector according to claim 1, wherein the second connecting end portion is crimped onto an end of the conductive wire to electrically connect with a conductor of the conductive wire.

9. The power connector according to claim 1, wherein the power connector further comprises a heat shrinkable tube on the second connecting end portion and on an end of the conductive wire.

10. The power connector according to claim 1, wherein the power connector further comprises at least one screw engaging with a thread hole of the insulation base and fastening the insulation base to the circuit board.

11. The power connector according to claim 1, wherein a top surface of the insulation base has at least one first positioning protrusion extending in a first direction and at least one second positioning protrusion extending in a second direction perpendicular to the first direction.

12. The power connector according to claim 11, wherein inner sides of the pair of intermediate connecting portions are positioned against both sides of the first positioning protrusion, and ends of the pair of intermediate connecting portions are positioned against the second positioning protrusions such that the first connecting end portion of the conductive terminal is perpendicular to the bottom surface of the insulation base.

13. The power connector according to claim 1, wherein the at least one conductive terminal includes a first conductive terminal for electrically connecting a first conductive wire to the circuit board and a second conductive terminal for electrically connecting a second conductive wire to the circuit board.

14. The power connector according to claim 13, wherein the insulation base is formed with a first slot corresponding to one of the pair of first connecting end portions of the first conductive terminal and a second slot corresponding to one of the pair of first connecting end portions of the second conductive terminal.

15. The power connector according to claim 13, wherein one of the first conductive terminal and the second conductive terminal is used as a positive power terminal and the other is used as a negative power terminal.

16. The power connector according to claim 1, wherein the bottom surface of the insulation base is parallel with a surface of the circuit board.

* * * * *